United States Patent
Chen et al.

(10) Patent No.: US 10,311,795 B2
(45) Date of Patent: Jun. 4, 2019

(54) SHIFT REGISTER UNIT, GATE DRIVER CIRCUIT AND DISPLAY DEVICE

(71) Applicants: Boe Technology Group Co., Ltd., Beijing (CN); Beijing Boe Display Technology Co., Ltd., Beijing (CN)

(72) Inventors: Huabin Chen, Beijing (CN); Ruirui Wang, Beijing (CN); Yingqiang Gao, Beijing (CN); Xiaopeng Cui, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 195 days.

(21) Appl. No.: 15/325,137

(22) PCT Filed: Aug. 9, 2016

(86) PCT No.: PCT/CN2016/094121
§ 371 (c)(1),
(2) Date: Jan. 10, 2017

(87) PCT Pub. No.: WO2017/118014
PCT Pub. Date: Jul. 13, 2017

(65) Prior Publication Data
US 2018/0182300 A1 Jun. 28, 2018

(30) Foreign Application Priority Data
Jan. 5, 2016 (CN) .................... 2016 2 0010179 U

(51) Int. Cl.
*G09G 3/3266* (2016.01)
*G09G 3/20* (2006.01)
(Continued)

(52) U.S. Cl.
CPC ............. *G09G 3/3266* (2013.01); *G09G 3/20* (2013.01); *G09G 3/3674* (2013.01); *G11C 19/28* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2008/0266275 A1 | 10/2008 | Tsai et al. | |
| 2011/0115839 A1* | 5/2011 | Takahashi | H01L 27/1225 345/698 |
| 2012/0105396 A1* | 5/2012 | Sakamoto | G09G 3/3677 345/204 |

FOREIGN PATENT DOCUMENTS

| | | |
|---|---|---|
| CN | 1835063 | 9/2006 |
| CN | 101719382 | 6/2010 |

(Continued)

OTHER PUBLICATIONS

International Search Report for PCT/CN2016/094121 dated Oct. 28, 2016.

*Primary Examiner* — Christopher J Kohlman
(74) *Attorney, Agent, or Firm* — Calfee, Halter & Griswold LLP

(57) ABSTRACT

A shift register unit is disclosed which includes an input module, a reset module, a node control module, a first output module and a second output module. Each of the shift register units can output two scan signals that have a phase difference with respect to each other. Also disclosed are a gate driver circuit and a display device.

18 Claims, 12 Drawing Sheets

(51) Int. Cl.
  *G09G 3/36* (2006.01)
  *G11C 19/28* (2006.01)
(52) U.S. Cl.
  CPC ............... *G09G 2310/0267* (2013.01); *G09G 2310/0286* (2013.01); *G09G 2310/061* (2013.01)

(56) References Cited

FOREIGN PATENT DOCUMENTS

| CN | 102034423 | 4/2011 |
| CN | 205282054 | 6/2016 |
| JP | 2014191848 | 10/2014 |

\* cited by examiner

SHIFT REGISTER UNIT, GATE DRIVER CIRCUIT AND DISPLAY DEVICE

The present application is the U.S. national phase entry of PCT/CN2016/094121, with an international filing date of Aug. 9, 2016, which claims the benefit of Chinese Patent Application No. 201620010179.3, filed on Jan. 5, 2016, the entire disclosures of which are incorporated herein by reference.

TECHNICAL FIELD

The present disclosure relates to the field of display technologies, and particularly to a shift register unit, a gate driver circuit, and a display device.

BACKGROUND

A display device typically includes a display panel, a gate driver circuit, and a data driver circuit. The display panel includes a plurality of gate lines, a plurality of data lines, and a plurality of pixels coupled to the gate lines and data lines. The gate driver circuit provides gate signals to the gate lines. The data driver circuit provides data signals to the data lines.

The gate driver circuit typically includes a plurality of shift register units that are cascaded with each other, each of which is connected to a respective gate line to provide a scan signal to the respective gate line. Because each gate line needs a shift register unit, the gate driver circuit is complicated in structure and occupies a large footprint. This is disadvantageous for a design with a very narrow bezel.

SUMMARY

Embodiments of the present disclosure provide a shift register unit, a gate driver circuit, and a display device, which may halve the number of the shift register units in the gate driver circuit.

According to a first aspect of the present disclosure, a shift register unit is provided which includes an input terminal, a reset terminal, a reference terminal, a first clock terminal, a second clock terminal, a third clock terminal, a first output terminal, a second output terminal, an input module for receiving an input signal from the input terminal and providing the input signal to a first node as a first level voltage, and a first reset module for receiving a reference voltage from the reference terminal and providing the reference voltage to the first node as a second level voltage in response to a reset signal from the reset terminal. The second level voltage is logically opposite to the first level voltage. The shift register unit further includes a node control module for receiving a third clock signal from the third clock terminal and the reference voltage and providing at a second node a second voltage signal logically opposite to a first voltage signal at the first node. The first voltage signal includes a portion having the first level voltage and a portion having the second level voltage. The shift register unit further includes a first output module for receiving a first clock signal from the first clock terminal and the reference voltage, and selectively providing the first clock signal or the reference voltage to the first output terminal in response to first voltage signal and the second voltage signal; and a second output module for receiving a second clock signal from the second clock terminal and the reference voltage, selectively providing the second clock signal or the reference voltage to the second output terminal in response to the first voltage signal and the second voltage signal, and maintaining a voltage difference between the first node and the second output terminal when the first node is floated.

In some embodiments, the first clock signal and the second clock signal have a phase difference of 90° with respect to each other, and the third clock signal and the second clock signal have phases opposite to each other.

In some embodiments, the node control module includes a first node control module for providing the reference voltage to the first node in response to the second voltage signal, and a second node control module for providing at the second node the second voltage signal in response to the third clock signal and the first voltage signal.

In some embodiments, the input module includes a first transistor having a source and a gate jointly connected to the input terminal and a drain connected to the first node.

In some embodiments, the first reset module includes a second transistor having a source connected to the reference terminal, a gate connected to the reset terminal, and a drain connected to the first node.

In some embodiments, the first output module includes: a third transistor having a source connected to the first clock terminal, a gate connected to the first node, and a drain connected to the first output terminal; and a fourth transistor having a source connected to the reference terminal, a gate connected to the second node, and a drain connected to the first output terminal.

In some embodiments, the second output module includes: a fifth transistor having a source connected to the second clock terminal, a gate connected to the first node, and a drain connected to the second output terminal; a sixth transistor having a source connected to the reference terminal, a gate connected to the second node, and a drain connected to the second output terminal; and a capacitor connected between the first node and the second output terminal.

In some embodiments, the first node control module includes a seventh transistor having a source connected to the reference terminal, a gate connected to the second node, and a drain connected to the first node.

In some embodiments, the second node control module includes: an eighth transistor having a source and a gate jointly connected to the third clock terminal, and a drain; a ninth transistor having a source connected to the third clock terminal, a gate connected to the drain of the eighth transistor, and a drain connected to the second node; a tenth transistor having a source connected to the reference terminal, a gate connected to the first node, and a drain connected to the drain of the eighth transistor; and an eleventh transistor having a source connected to the reference terminal, a gate connected to the first node, and a drain connected to the second node.

In some embodiments, the shift register unit further includes a second reset module for providing the reference voltage to the second output terminal in response to the reset signal.

In some embodiments, the second reset module includes a twelfth transistor having a source connected to the reference terminal, a gate connected to the reset terminal, and a drain connected to the second output terminal.

According to a second aspect of the present disclosure, a gate driver circuit is provided which includes a plurality of shift register units as recited in the first aspect that are cascaded with each other. The input terminal of the first stage of shift register unit is configured to receive a start signal, the input terminal of each of the shift register units except for the first stage of shift register unit is connected to the second output terminal of a previous stage of shift register unit, and the reset terminal of each of the shift register units except for the last stage of shift register unit is connected to the second output terminal of a next stage of shift register unit.

According a third aspect of the present disclosure, a display device is provided which includes a display panel comprising 2N gate lines (where N is a positive integer), and a gate driver circuit as recited in the second aspect. The first output terminal and the second output terminal of the n-th stage of shift register unit of the gate driver circuit are connected to the (2n−1)th gate line and the 2n-th gate line, respectively, where n is a positive integer and $1 \leq n \leq N$.

These and other aspects of the present disclosure will be apparent from and elucidated with reference to the embodiment(s) described hereinafter.

BRIEF DESCRIPTION OF THE DRAWINGS

FIG. 2a is another schematic block diagram of the shift register unit of FIG. 1a;

FIG. 4a is a time sequence diagram of the shift register unit of FIG. 3a;

DETAILED DESCRIPTION

The shift register unit, the gate driver circuit and the display panel according to embodiments of the present disclosure will be described in detail with reference to the drawings.

Figure 1A:
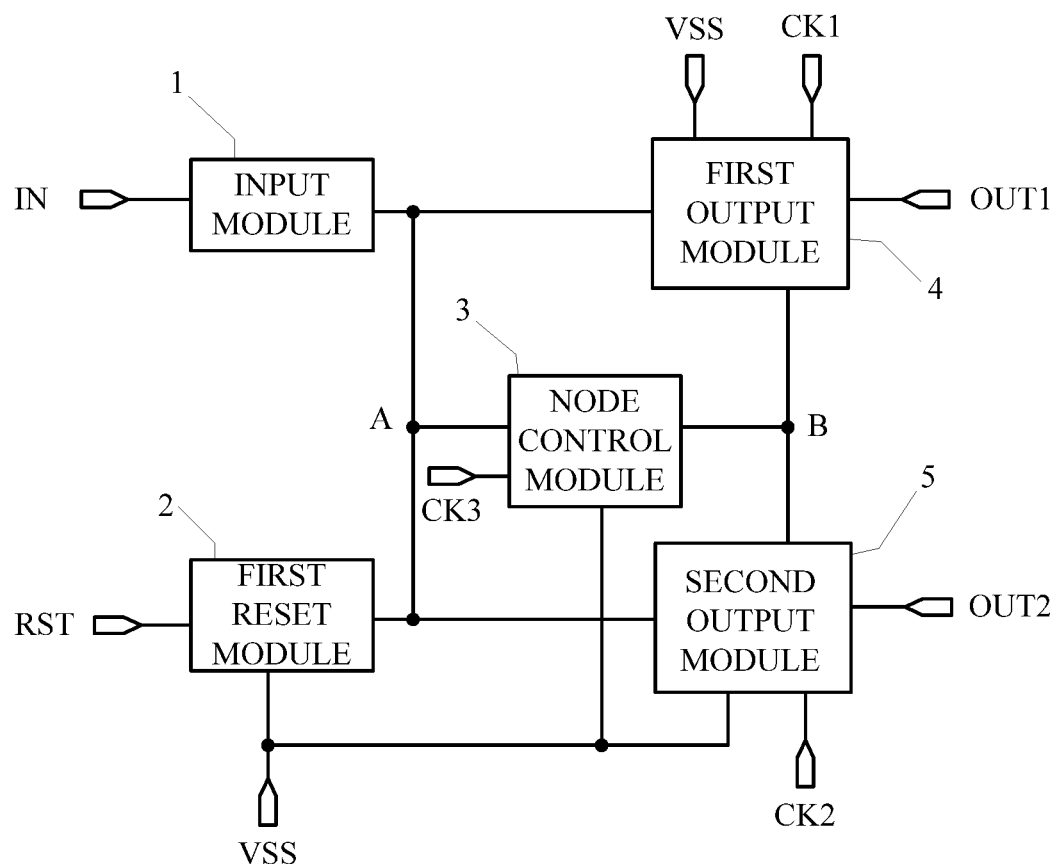
FIG. 1a is a schematic block diagram of a shift register unit according to an embodiment of the present disclosure.

FIG. 1a is a schematic block diagram of a shift register unit according to an embodiment of the present disclosure.

Referring to FIG. 1a, the shift register unit includes an input module 1, a first reset module 2, a node control module 3, a first output module 4 and a second output module 5. The shift register unit further has an input terminal IN, a reset terminal RST, a reference terminal VSS, a first clock terminal CK1, a second clock terminal CK2, a third clock terminal CK3, a first output terminal OUT1, a second output terminal OUT2.

The input module 1 receives an input signal from the input terminal IN and providing the input signal to a first node A as a first level voltage;

The first reset module 2 receives a reference voltage from the reference terminal VSS, and provides the reference voltage to the first node A as a second level voltage in response to a reset signal from the reset terminal RST. The second level voltage is logically opposite to the first level voltage.

The node control module 3 receives a third clock signal from the third clock terminal CK3 and the reference voltage from the reference terminal VSS, and provides at a second node B a second voltage signal logically opposite to a first voltage signal at the first node A. The first voltage signal includes a portion having the first level voltage and a portion having the second level voltage.

The first output module 4 receives a first clock signal from the first clock terminal CK1 and the reference voltage from the reference terminal VSS, and selectively provides the first clock signal or the reference voltage to the first output terminal OUT1 in response to first voltage signal and the second voltage signal; and The second output module 5 receives a second clock signal from the second clock terminal CK2 and the reference voltage from the reference terminal VSS, selectively provides the second clock signal or the reference voltage to the second output terminal OUT2 in response to the first voltage signal and the second voltage signal, and maintains a voltage difference between the first node A and the second output terminal OUT2 when the first node A is floated.

As will be described hereinafter, the first clock signal and the second clock signal have a phase difference of 90° with respect to each other, and the third clock signal has an opposite phase to the second clock signal.

In some embodiments, the input signal is active-high, and the reference voltage from the reference terminal VSS has a low level. That is, the first level voltage has a high level, and the second level voltage has a low level. In some embodiments, the input signal is active-low, and the reference voltage from the reference terminal VSS has a high level. That is, the first level voltage has a low level, and the second level voltage has a high level.

Figure 1B:
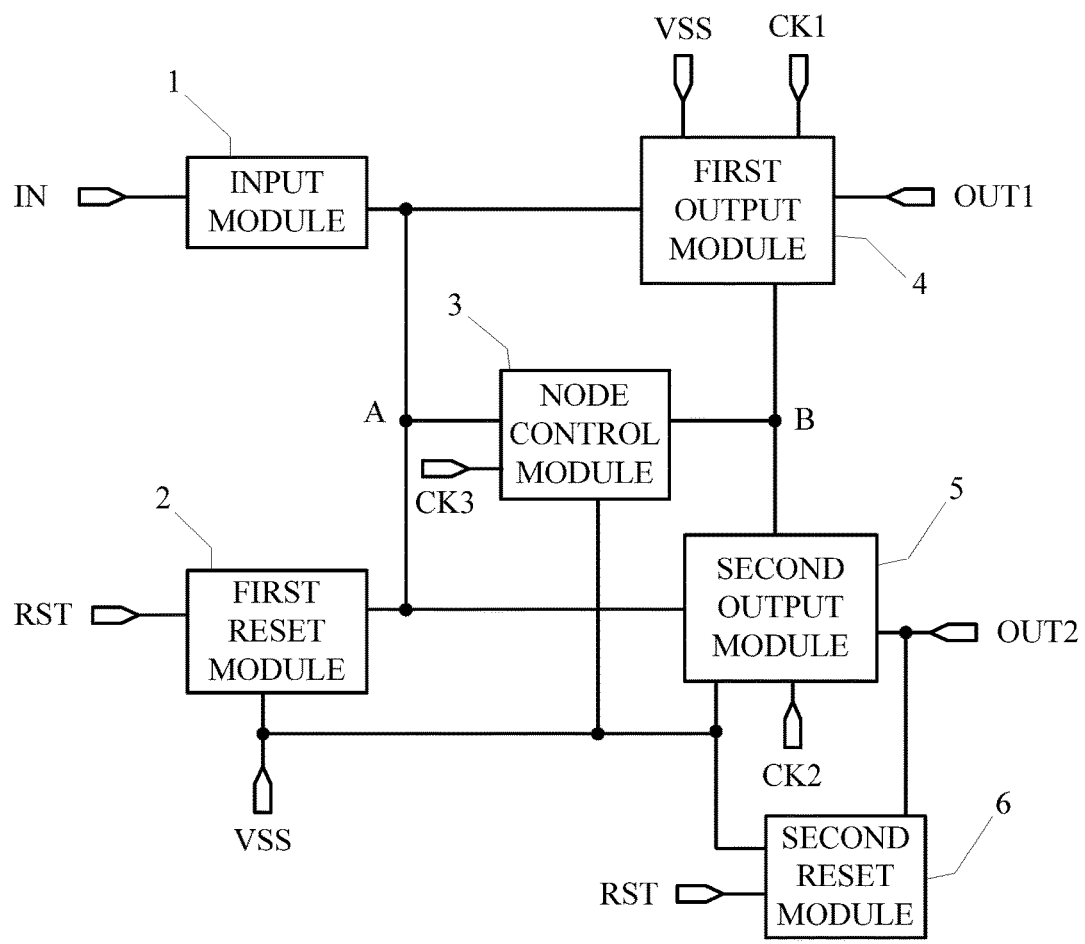
FIG. 1b is a schematic block diagram of a shift register unit according to another embodiment of the present disclosure.

FIG. 1b is a schematic block diagram of a shift register unit according to another embodiment of the present disclosure.

Referring to FIG. 1b, the shift register unit further includes a second reset module 6 as compared to the embodiment of FIG. 1a. The second reset module 6 provides the reference voltage from the reference terminal VSS to the second output terminal OUT2 in response to the reset signal from the reset terminal RST. The second reset module 6 enables the voltage at the second output terminal OUT2 to go back to the reference voltage timely from an active voltage.

Figure 2A:
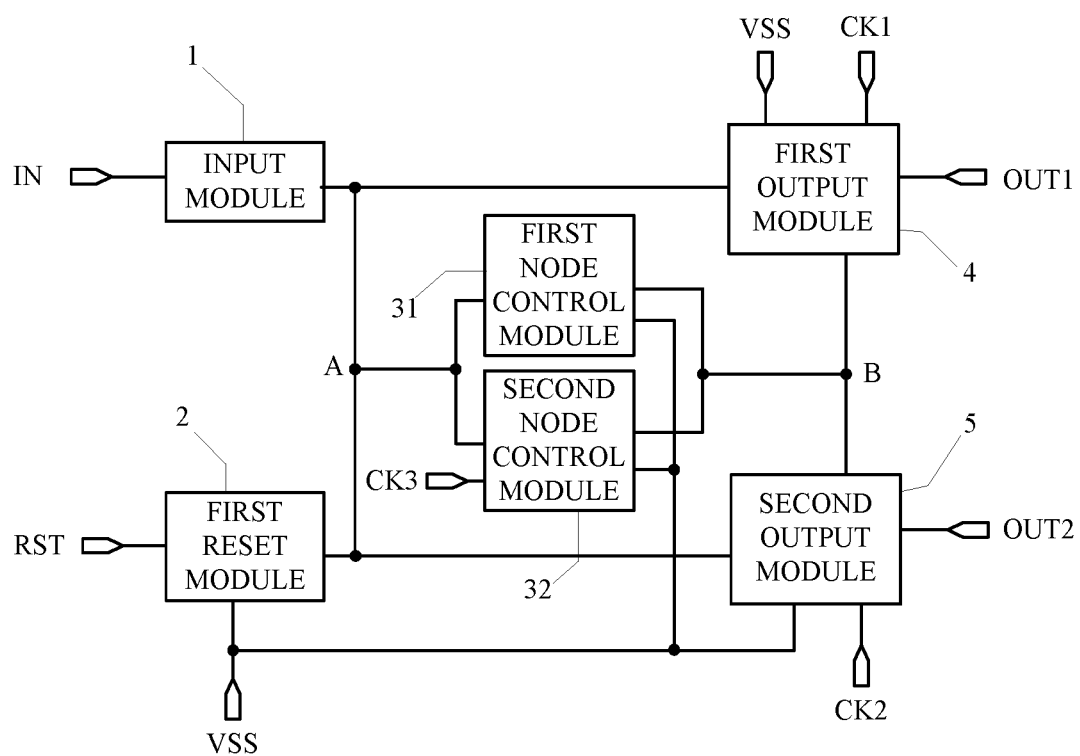
Figure 2B:
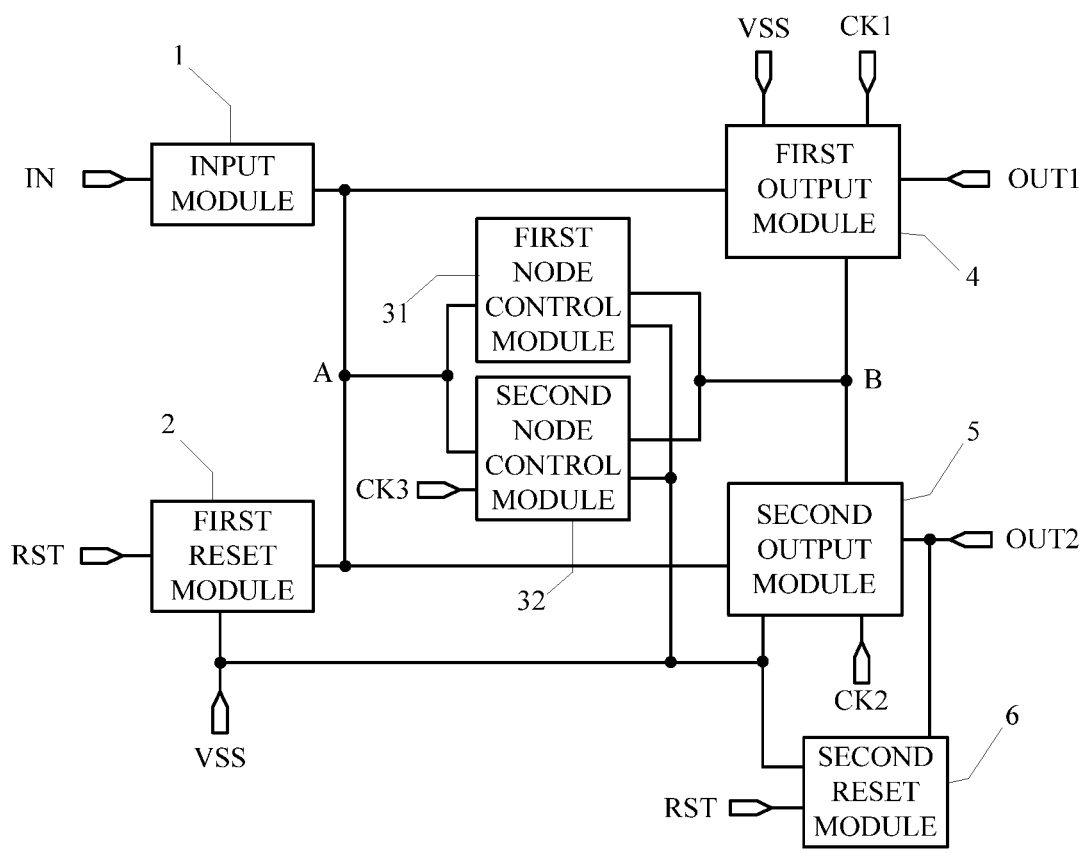
FIG. 2b is another schematic block diagram of the shift register unit of FIG. 1b.

FIGS. 2a and 2b show another schematic block diagram of the shift register unit of FIGS. 1a and 1b, respectively.

Referring to FIGS. 2a and 2b, the node control module 3 includes a first node control module 31 and a second node control module 32.

The first node control module 31 provides the reference voltage from the reference terminal VSS to the first node A in response to the second voltage signal at the second node B.

The second node control module 32 provides at the second node B the second voltage signal in response to the third clock signal from the third clock terminal CK3 and the first voltage signal at the first node A.

Figure 3A:
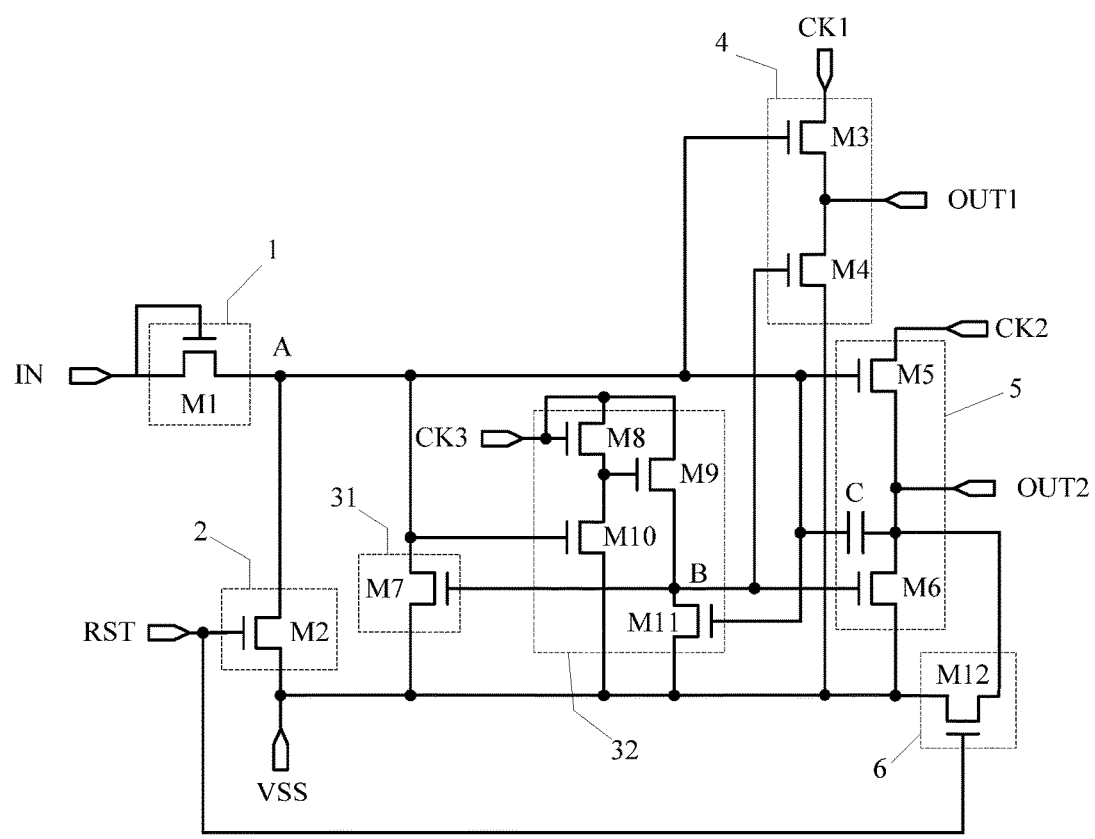
FIG. 3a is a schematic circuit diagram of the shift register unit of FIG. 2b.
Figure 3B:
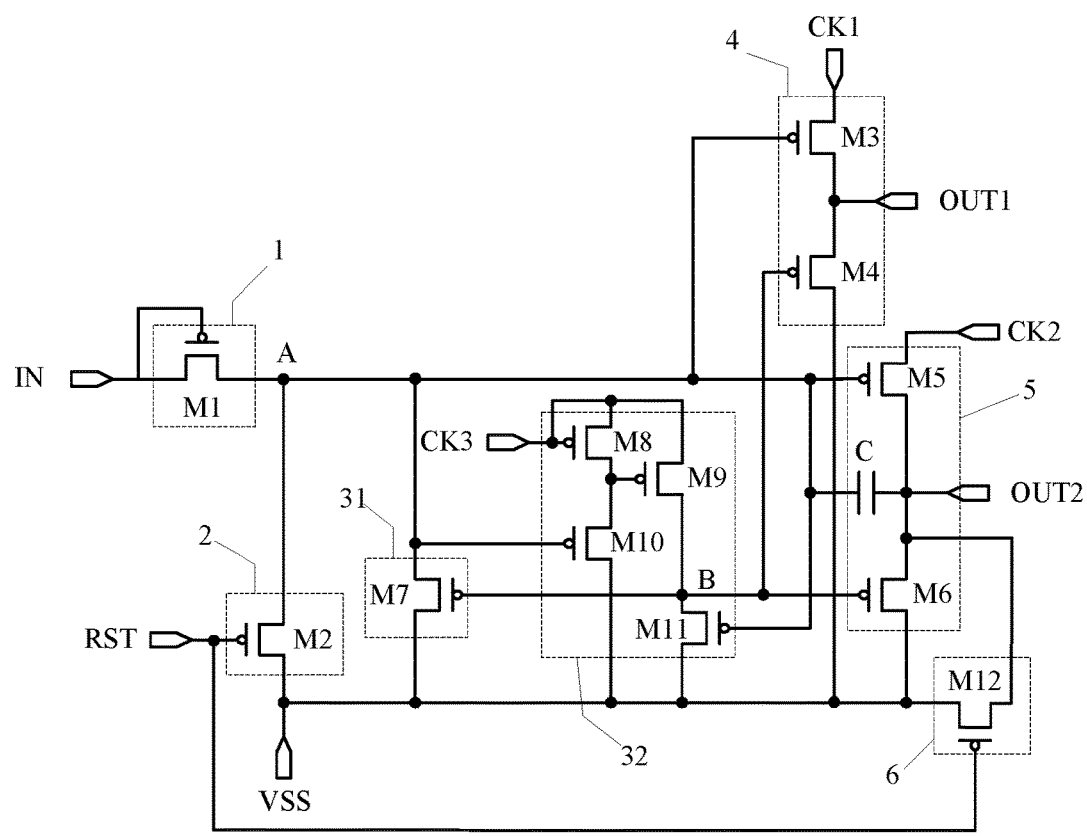
FIG. 3b is another schematic circuit diagram of the shift register unit of FIG. 2b.

FIGS. 3a and 3b are schematic circuit diagrams of the shift register unit of FIG. 2b, wherein FIG. 3a shows a shift register unit circuit formed by N-type transistors, and FIG. 3b shows a shift register unit circuit formed by P-type transistors.

The input module 1 includes a first transistor M1. The first transistor M1 has a source and a gate jointly connected to the input terminal IN and a drain connected to the first node A. The first transistor M1 provides the input signal from the input terminal IN to the first node A when it is turned on.

The first reset module 2 includes a second transistor M2. The second transistor M2 has a source connected to the reference terminal VSS, a gate connected to the reset terminal RST, and a drain connected to the first node A. The second transistor M2 provides the reference voltage from the reference terminal VSS to the first node A when it is turned on.

The first output module 4 includes a third transistor M3 and a fourth transistor M4. The third transistor M3 has a source connected to the first clock terminal CK1, a gate connected to the first node A, and a drain connected to the first output terminal OUT1. The fourth transistor M4 has a source connected to the reference terminal VSS, a gate connected to the second node B, and a drain connected to the first output terminal OUT1. The third transistor M3 provides the first clock signal from the first clock terminal CK1 to the first output terminal OUT1 when it is turned on. The fourth transistor M4 provides the reference voltage from the reference terminal VSS to the first output terminal OUT1 when it is turned on.

The second output module 5 includes a fifth transistor M5, a sixth transistor M6 and a capacitor C. The fifth transistor M5 has a source connected to the second clock terminal CK2, a gate connected to the first node A, and a drain connected to the second output terminal OUT2. The sixth transistor M6 has a source connected to the reference terminal VSS, a gate connected to the second node B, and a drain connected to the second output terminal OUT2. The capacitor C is connected between the first node A and the second output terminal OUT2. The fifth transistor M5 provides the second clock signal from the second clock terminal CK2 to the second output terminal OUT2 when it is turned on. The sixth transistor M6 provides the reference voltage from the reference terminal VSS to the second output terminal OUT2 when it is turned on. When the first node A is floated, the voltage difference across the capacitor C is maintained due to the bootstrap of the capacitor. Namely, the voltage difference between the first node A and the second output terminal OUT2 is maintained.

The first node control module 31 includes a seventh transistor M7. The seventh transistor M7 has a source connected to the reference terminal VSS, a gate connected to the second node B, and a drain connected to the first node A. The seventh transistor M7 provides the reference voltage from the reference terminal VSS to the first node A when it is turned on.

The second node control module 32 includes an eighth transistor M8, a ninth transistor M9, a tenth transistor M10, and an eleventh transistor M11. A source and a gate of the eighth transistor M8 are jointly connected to the third clock terminal CK3, and a drain thereof is connected to a gate of the ninth transistor M9 and a drain of the tenth transistor M10. A source of the ninth transistor M9 is connected to the third clock terminal CK3, and a drain thereof is connected to the second node B. A gate of the tenth transistor is connected to the first node A, and a source thereof is connected to the reference terminal VSS. A source of the eleventh transistor M11 is connected to the reference terminal VSS, a gate thereof is connected to the first node A, and a drain thereof is connected to the second node B. When it is turned on, the eighth transistor M8 provides the third clock signal from the third clock terminal CK3 to the gate of the ninth transistor M9 and the drain of the tenth transistor M10. When it is turned on, the ninth transistor M9 provides the third clock signal from the third clock terminal CK3 to the second node B. When it is turned on, the tenth transistor M10 provides the reference voltage from the reference terminal VSS to the gate of the ninth transistor M9. When it is turned on, the eleventh transistor M11 provides the reference voltage from the reference terminal VSS to the second node B.

The second reset module 6 includes a twelfth transistor M12. The twelfth transistor M12 has a source connected to the reference terminal VSS, a gate connected to the reset terminal RST, and a drain connected to the second output terminal OUT2. When it is turned on, the twelfth transistor M12 provides the reference voltage from the reference terminal VSS to the second output terminal OUT2.

Although in FIGS. 3a and 3b all the transistors are illustrated as having the same type (either an N-type or a P-type), the present disclosure is not limited thereto. Where appropriate, at least one of the transistors may have a different type from that of the others. An N-type transistor is turned on by a high level voltage on its gate, and is turned off by a low level voltage on its gate. A P-type transistor is turned on by a low level voltage on its gate, and is turned off by a high level voltage on its gate.

In embodiments, the transistors may be thin film transistors (TFTs) or metal oxide semiconductor field effect transistor (MOSFET). These transistors are typically fabricated such that their sources and drains can be used interchangeably.

Figure 4A:
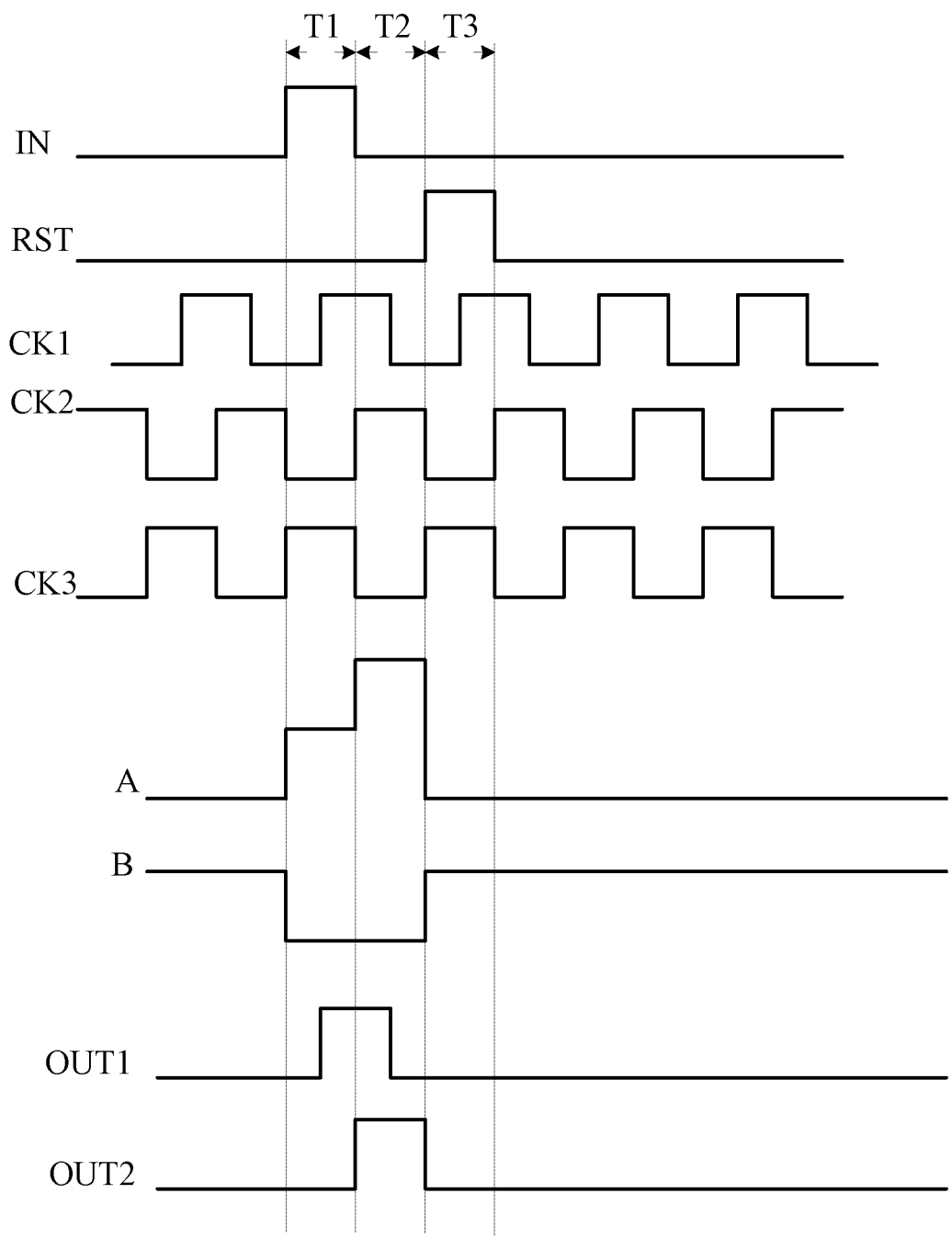

Operations of the shift register unit as shown in FIG. 3a are described below in connection with the time sequence diagram as shown in FIG. 4a. In the following description, "1" represents a high level signal, and "0" represents a low level signal.

As shown in FIG. 4a, the input signal from the input terminal IN and the reset signal from the reset terminal RST are active-high. The first clock signal and the second clock signal have a phase difference of 90° with respect to each other, and the third clock signal has an opposite phase to the second clock signal. The reference voltage (not shown) from the reference terminal VSS has a low level. A first phase T1, a second phase T2 and a third phase T3 in the time sequence diagram as shown in FIG. 4a are chosen for illustration.

At the first half of the first phase T1, IN=1, RST=0, CK1=0, CK2=0 and CK3=1. As RST=0, both the second transistor M2 and the twelfth transistor M12 are turned off. As IN=1, the first transistor M1 is turned on and provides the input signal from the input terminal IN to the first node A, such that the first node A is at a high level. As such, the third transistor M3, the fifth transistor M5, the tenth transistor M10 and the eleventh transistor M11 are all turned on. The turned-on tenth transistor M10 provides the reference voltage from the reference terminal VSS to the gate of the ninth transistor M9, such that the ninth transistor M9 is turned off. The turned-on eleventh transistor M11 provides the reference voltage from the reference terminal VSS to the second node B, such that the second node B is at a low level. As such, the fourth transistor M4, the sixth transistor M6 and the seventh transistor M7 are all turned off. The turned-on third transistor M3 provides the first clock signal from the first clock terminal CK1 to the first output terminal OUT1, such that the first output terminal OUT1 outputs a low level voltage. The turned-on fifth transistor M5 provides the second clock signal from the second clock terminal CK2 to the second output terminal OUT2, such that the second output terminal OUT2 outputs a low level voltage. The capacitor C is charged.

At the second half of the first phase T1, IN=1, RST=0, CK1=1, CK2=0 and CK3=1. The ON/OFF states of the transistors remain unchanged. The turned-on first transistor M1 provides the input signal from the first transistor M1 to the first node A, such that the first node A is at a high level. The turned-on eleventh M11 provides the reference voltage from the reference terminal VSS to the second node B, such that the second node B is at a low level. The turned-on third transistor M3 provides the first clock signal from the first clock terminal CK1 to the first output terminal OUT1, such that the first output terminal OUT1 outputs a high level voltage. The turned-on fifth transistor M5 provides the second clock signal from the second clock terminal CK2 to the second output terminal OUT2, such that the second output terminal OUT2 outputs a low level voltage. The capacitor C continues to be charged.

At the first half of the second phase T2, IN=0, RST=0, CK1=1, CK2=1 and CK3=0. As IN=0, the first transistor M1 is turned off. As RST=0, both the second transistor M2 and the twelfth transistor M12 are turned off. As CK3=0, the eighth transistor M8 is turned off. As the first transistor M1 and the second transistor M2 are turned off, the first node A is floated. The capacitor C keeps the third transistor M3, the fifth transistor M5, the tenth transistor M10 and the eleventh transistor M11 turned on. The turned-on eleventh transistor M11 provides the reference voltage from the reference terminal VSS to the second node B, such that the second node B is at a low level. The turned-on fifth transistor M5 provides the second clock signal from the second clock terminal CK2 to the second output terminal OUT2, such that the second output terminal OUT2 outputs a low level voltage. Due to the bootstrap of the capacitor C, the voltage at the first node A is further pulled high (to a high level voltage notwithstanding) to ensure that the third transistor M3 is turned on. The turned-on M3 provides the first clock signal from the first clock terminal CK1 to the first output terminal OUT1, such that the first output terminal OUT1 outputs a high level voltage.

At the second half of the second phase T2, IN=0, RST=0, CK1=0, CK2=1 and CK3=0. The ON/OFF states of the transistors remain unchanged. The voltage of the floated first node A remains at a high level. The turned-on eleventh M11 provides the reference voltage from the reference terminal VSS to the second node B, such that the second node B is at a low level. The turned-on fifth transistor M5 provides the second clock signal from the second clock terminal CK2 to the second output terminal OUT2, such that the second output terminal OUT2 outputs a high level voltage. The turned-on third transistor M3 provides the first clock signal from the first clock terminal CK1 to the first output terminal OUT1, such that the first output terminal OUT1 outputs a low level voltage.

At the first half of the third phase T3, IN=0, RST=1, CK1=0, CK2=0 and CK3=1. As IN=0, the first transistor M1 is turned off. As RST=1, both the second transistor M2 and the twelfth transistor M12 are turned on. The turned-on second transistor M2 provides the reference voltage from the reference terminal VSS to the first node A, such that the first node A is at a low level. As such, the third transistor M3, the fifth transistor M5, the tenth transistor M10 and the eleventh transistor M11 are turned off. As CK3=1, the eighth transistor M8 is turned on. The turned-on eighth transistor M8 provides the third clock signal from the third clock terminal CK3 to the gate of the ninth transistor M9, such that the ninth transistor M9 is turned on. The turned-on ninth transistor M9 provides the third clock signal from the third clock terminal CK3 to the second node B, such that the second node B is at a high level. As such, the fourth transistor M4, the sixth transistor M6 and the seventh transistor M7 are all turned on. The turned-on seventh transistor M7 provides the reference voltage from the reference terminal VSS to the first node A, further ensuring that the first node A is at a low level. The third transistor M3 and the fifth transistor M5 remains turned off. The turned-on fourth transistor M4 provides the reference voltage from the reference terminal VSS to the first output terminal OUT1, such that the first output terminal OUT1 outputs a low level voltage. The turned-on sixth transistor M6 provides the reference voltage from the reference terminal VSS to the second output terminal OUT2, such that the second output terminal OUT2 outputs a low level voltage. The turned-on twelfth transistor M12 provides the reference voltage from the reference terminal VSS to the second output terminal OUT2, such that the voltage at the second output terminal OUT2 can go back timely from the active voltage during the second phase T2 to the reference voltage.

At the second half of the third phase T3, IN=0, RST=1, CK1=1, CK2=0 and CK3=1. The ON/OFF states of the transistors remain unchanged. The turned-on second M2 provides the reference voltage from the reference terminal VSS to the first node A, such that the first node A is at a low level. The turned-on fifth transistor M5 provides the third clock signal from the third clock terminal CK3 to the second node B, such that the second node B is at a high level. The turned-on seventh transistor M7 provides the reference voltage from the reference terminal VSS to the first node A, further ensuring that the first node A is at a low level. The turned-on fourth transistor M4 provides the reference voltage from the reference terminal VSS to the first output terminal OUT1, such that the first output terminal OUT1 outputs a low level voltage. The turned-on sixth transistor M6 provides the reference voltage from the reference terminal VSS to the second output terminal OUT2, such that the second output terminal OUT2 outputs a low level voltage.

Thereafter, the input signal and the reset signal remain at a low level. Only the alternation of the third clock signal affects the operations of the shift register unit. When the third clock signal is at a high level, the eighth transistor M8 and the ninth transistor M9 are turned on, such that the second node B is at a high level. As such, the fourth transistor M4, the sixth transistor M6 and the seventh transistor M7 are turned on. The first node A is at a low level, the first output terminal OUT1 outputs a low level voltage, and the second output terminal OUT2 outputs a low level voltage. When the third clock signal is at a low level, no active control signal is input to the shift register unit. The level of the first node A and level of the second node B remain unchanged, the first output terminal OUT1 keeps outputting a low level voltage, and the second output terminal OUT2 keeps outputting a low level voltage.

As shown in FIGS. 3a and 4a, the shift register unit has two output terminals OUT1 and OUT2, and these two output terminals output two signals that have a phase difference with respect to each other. These two signals can be provided to respective gate lines as gate signals.

Figure 4B:
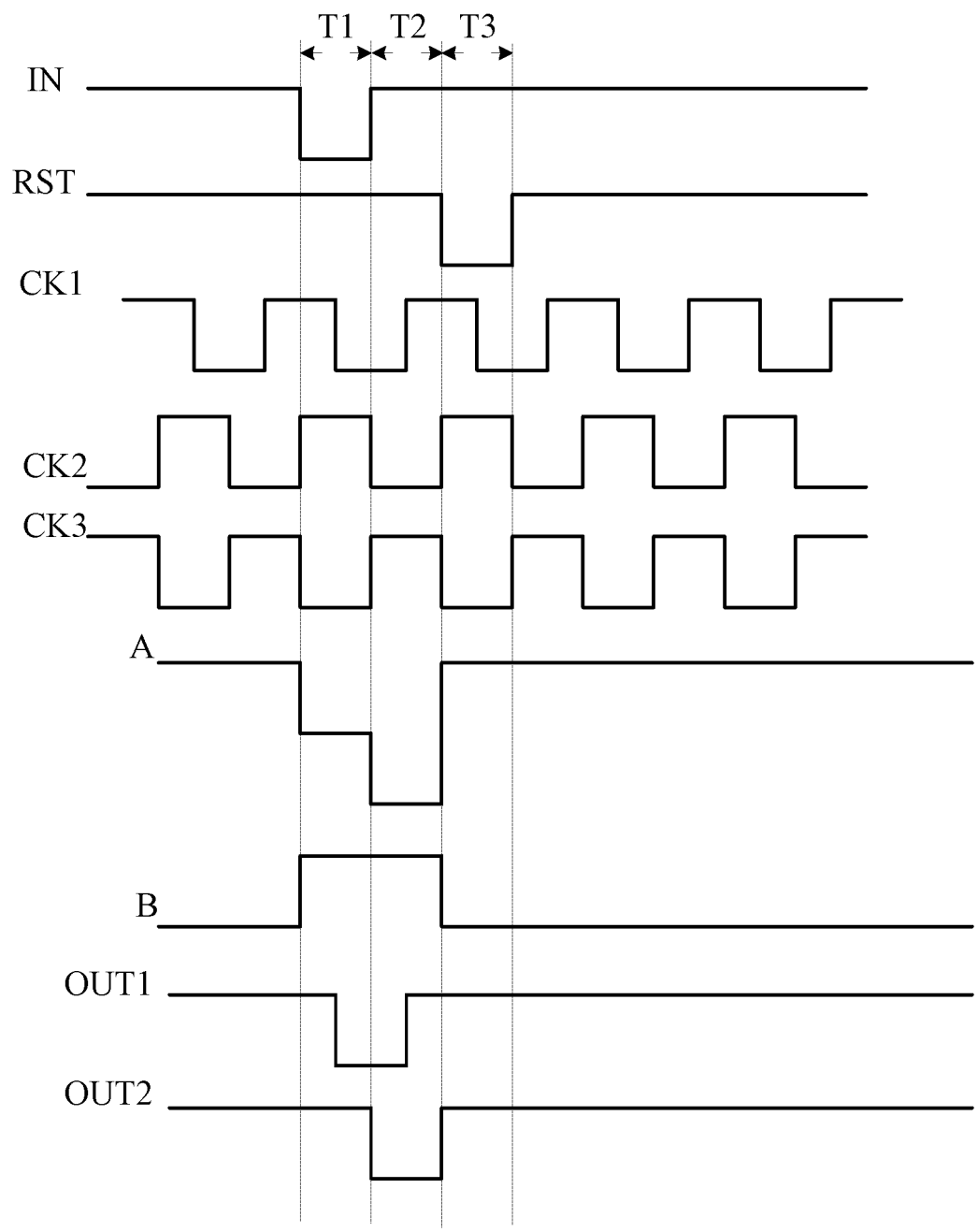
FIG. 4b is a time sequence diagram of the shift register unit of FIG. 3b.

Operations of the shift register unit as shown in FIG. 3b are described below in connection with the time sequence diagram as shown in FIG. 4b. In the following description, "1" represents a high level signal, and "0" represents a low level signal.

As shown in FIG. 4b, the input signal from the input terminal IN and the reset signal from the reset terminal RST are active-low. The first clock signal and the second clock signal have a phase difference of 90° with respect to each other, and the third clock signal has an opposite phase to the second clock signal. The reference voltage (not shown) from the reference terminal VSS has a high level. A first phase T1, a second phase T2 and a third phase T3 in the time sequence diagram as shown in FIG. 4b are chosen for illustration.

At the first half of the first phase T1, IN=0, RST=1, CK1=1, CK2=1 and CK3=0. As RST=1, both the second transistor M2 and the twelfth transistor M12 are turned off. As IN=0, the first transistor M1 is turned on and provides the input signal from the input terminal IN to the first node A, such that the first node A is at a low level. As such, the third transistor M3, the fifth transistor M5, the tenth transistor M10 and the eleventh transistor M11 are all turned on. The turned-on tenth transistor M10 provides the reference voltage from the reference terminal VSS to the gate of the ninth transistor M9, such that the ninth transistor M9 is turned off. The turned-on eleventh transistor M11 provides the reference voltage from the reference terminal VSS to the second node B, such that the second node B is at a high level. As such, the fourth transistor M4, the sixth transistor M6 and the seventh transistor M7 are all turned off. The turned-on third transistor M3 provides the first clock signal from the first clock terminal CK1 to the first output terminal OUT1, such that the first output terminal OUT1 outputs a high level voltage. The turned-on fifth transistor M5 provides the second clock signal from the second clock terminal CK2 to the second output terminal OUT2, such that the second output terminal OUT2 outputs a high level voltage. The capacitor C is charged.

At the second half of the first phase T1, IN=0, RST=1, CK1=0, CK2=1 and CK3=0. The ON/OFF states of the transistors remain unchanged. The turned-on first transistor M1 provides the input signal from the first transistor M1 to the first node A, such that the first node A is at a low level. The turned-on eleventh M11 provides the reference voltage from the reference terminal VSS to the second node B, such that the second node B is at a high level. The turned-on third transistor M3 provides the first clock signal from the first clock terminal CK1 to the first output terminal OUT1, such that the first output terminal OUT1 outputs a low level voltage. The turned-on fifth transistor M5 provides the second clock signal from the second clock terminal CK2 to the second output terminal OUT2, such that the second output terminal OUT2 outputs a high level voltage. The capacitor C continues to be charged.

At the first half of the second phase T2, IN=1, RST=1, CK1=0, CK2=0 and CK3=1. As IN=1, the first transistor M1 is turned off. As RST=1, both the second transistor M2 and the twelfth transistor M12 are turned off. As CK3=1, the eighth transistor M8 is turned off. As the first transistor M1 and the second transistor M2 are turned off, the first node A is floated. The capacitor C keeps the third transistor M3, the fifth transistor M5, the tenth transistor M10 and the eleventh transistor M11 turned on. The turned-on eleventh transistor M11 provides the reference voltage from the reference terminal VSS to the second node B, such that the second node B is at a high level. The turned-on fifth transistor M5 provides the second clock signal from the second clock terminal CK2 to the second output terminal OUT2, such that the second output terminal OUT2 outputs a low level voltage. Due to the bootstrap of the capacitor C, the voltage at the first node A is further pulled low (to a low level voltage notwithstanding) to ensure that the third transistor M3 is turned on. The turned-on M3 provides the first clock signal from the first clock terminal CK1 to the first output terminal OUT1, such that the first output terminal OUT1 outputs a low level voltage.

At the second half of the second phase T2, IN=1, RST=1, CK1=1, CK2=0 and CK3=1. The ON/OFF states of the transistors remain unchanged. The voltage of the floated first node A remains at a low level. The turned-on eleventh M11 provides the reference voltage from the reference terminal VSS to the second node B, such that the second node B is at a high level. The turned-on fifth transistor M5 provides the second clock signal from the second clock terminal CK2 to the second output terminal OUT2, such that the second output terminal OUT2 outputs a low level voltage. The turned-on third transistor M3 provides the first clock signal from the first clock terminal CK1 to the first output terminal OUT1, such that the first output terminal OUT1 outputs a low high voltage.

At the first half of the third phase T3, IN=1, RST=0, CK1=1, CK2=1 and CK3=0. As IN=1, the first transistor M1 is turned off. As RST=0, both the second transistor M2 and the twelfth transistor M12 are turned on. The turned-on second transistor M2 provides the reference voltage from the reference terminal VSS to the first node A, such that the first node A is at a high level. As such, the third transistor M3, the fifth transistor M5, the tenth transistor M10 and the eleventh transistor M11 are turned off. As CK3=0, the eighth transistor M8 is turned on. The turned-on eighth transistor M8 provides the third clock signal from the third clock terminal CK3 to the gate of the ninth transistor M9, such that the ninth transistor M9 is turned on. The turned-on ninth transistor M9 provides the third clock signal from the third clock terminal CK3 to the second node B, such that the second node B is at a low level. As such, the fourth transistor M4, the sixth transistor M6 and the seventh transistor M7 are all turned on. The turned-on seventh transistor M7 provides the reference voltage from the reference terminal VSS to the first node A, further ensuring that the first node A is at a high level. The third transistor M3 and the fifth transistor M5 remains turned off. The turned-on fourth transistor M4 provides the reference voltage from the reference terminal VSS to the first output terminal OUT1, such that the first output terminal OUT1 outputs a high level voltage. The turned-on sixth transistor M6 provides the reference voltage from the reference terminal VSS to the second output terminal OUT2, such that the second output terminal OUT2 outputs a high level voltage. The turned-on twelfth transistor M12 provides the reference voltage from the reference terminal VSS to the second output terminal OUT2, such that the voltage at the second output terminal OUT2 can go back timely from the active voltage during the second phase T2 to the reference voltage.

At the second half of the third phase T3, IN=1, RST=0, CK1=0, CK2=1 and CK3=0. The ON/OFF states of the transistors remain unchanged. The turned-on second M2 provides the reference voltage from the reference terminal VSS to the first node A, such that the first node A is at a high level. The turned-on fifth transistor M5 provides the third clock signal from the third clock terminal CK3 to the second node B, such that the second node B is at a low level. The turned-on seventh transistor M7 provides the reference voltage from the reference terminal VSS to the first node A, further ensuring that the first node A is at a high level. The turned-on fourth transistor M4 provides the reference voltage from the reference terminal VSS to the first output terminal OUT1, such that the first output terminal OUT1 outputs a high level voltage. The turned-on sixth transistor M6 provides the reference voltage from the reference terminal VSS to the second output terminal OUT2, such that the second output terminal OUT2 outputs a high level voltage.

Thereafter, the input signal and the reset signal remain at a high level. Only the alternation of the third clock signal affects the operations of the shift register unit. When the third clock signal is at a low level, the eighth transistor M8 and the ninth transistor M9 are turned on, such that the second node B is at a low level. As such, the fourth transistor M4, the sixth transistor M6 and the seventh transistor M7 are turned on. The first node A is at a high level, the first output terminal OUT1 outputs a high level voltage, and the second output terminal OUT2 outputs a high level voltage. When the third clock signal is at a high level, no active control signal is input to the shift register unit. The level of the first node A and level of the second node B remain unchanged, the first output terminal OUT1 keeps outputting a high level voltage, and the second output terminal OUT2 keeps outputting a high level voltage.

As shown in FIGS. 3b and 4b, the shift register unit has two output terminals OUT1 and OUT2, and these two output terminals output two signals that have a phase difference with respect to each other. These two signals can be provided to respective gate lines as gate signals.

Figure 5:
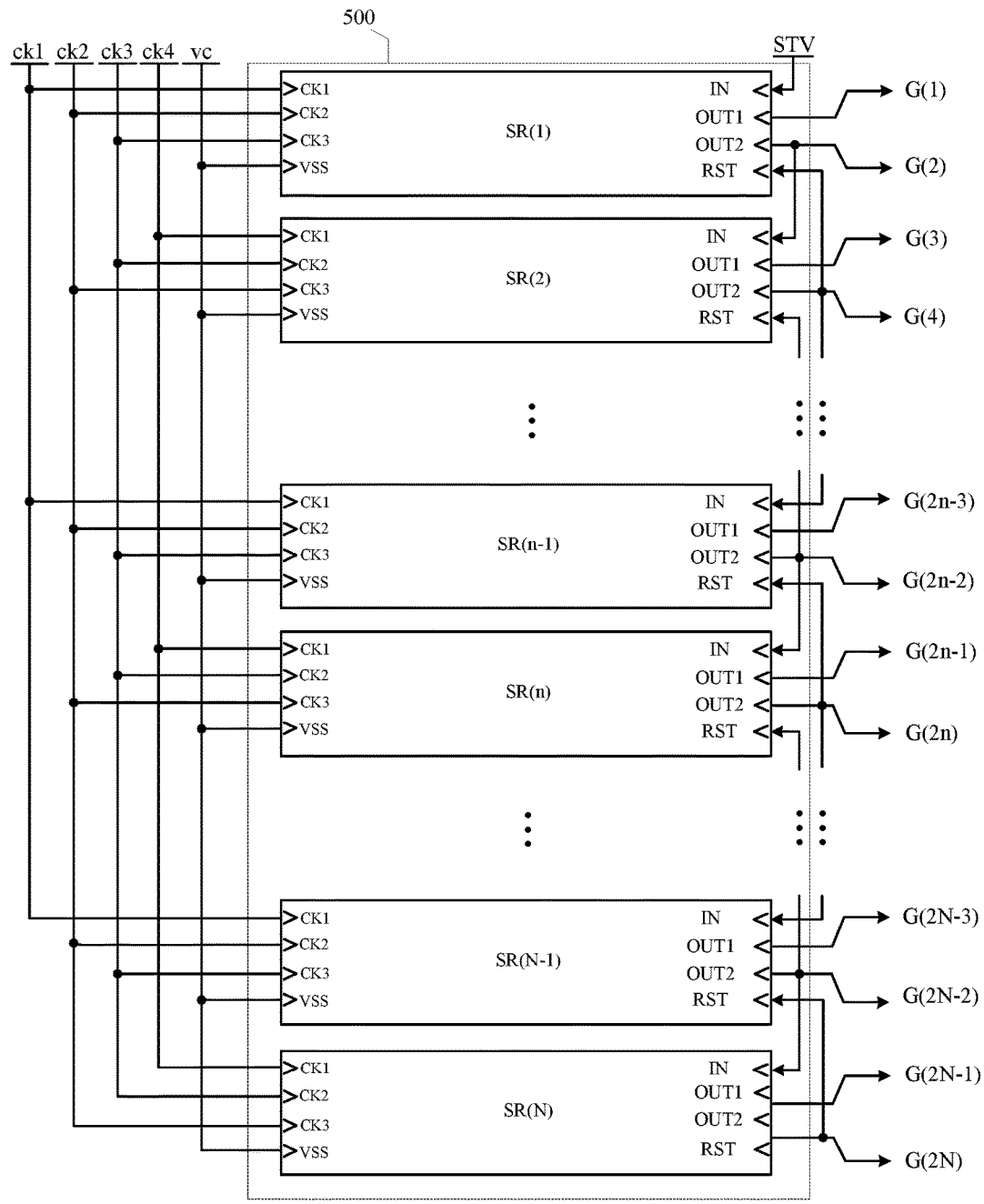
FIG. 5 is a schematic block diagram of a gate driver circuit according to an embodiment of the present disclosure.

FIG. 5 is a schematic block diagram of a gate driver circuit 500 according to an embodiment of the present disclosure.

Referring to FIG. 5, the gate driver circuit 500 includes a plurality of shift register units SR(1), SR(2) . . . SR(n-1), SR(n) SR(N-1), SR(N) that are cascaded with each other, wherein n and N are positive integers, and $2 \le n \le N$.

Each of the shift register units of the gate driver circuit 500 may be the shift register unit as described in the above embodiments. As shown in FIG. 5, each of the shift register units includes an input terminal IN, a first clock terminal CK1, a second clock terminal CK2, a third clock terminal CK3, a reset terminal RST, a reference terminal VSS, a first output terminal OUT1 and a second output terminal OUT2.

The input terminal IN of the first stage of shift register unit SR(1) is supplied with a frame start signal STV. The input terminal IN of each of the shift register units SR(n) except for the first stage of shift register unit SR(1) is connected to the second output terminal OUT2 of a previous stage of shift register unit SR(n-1). The reset terminal RST of each of the shift register units SR(n-1) except for the last stage of shift register unit SR(N) is connected to the second output terminal OUT2 of a next stage of shift register unit SR(n).

The first clock terminals CK1 of odd shift register units are supplied with a clock signal ck1. The second clock terminals CK2 of odd shift register units and the third clock terminal CK3 of even shift register units are supplied with a clock signal ck2. The third clock terminals CK3 of odd shift register units and the second clock terminal CK2 of even shift register units are supplied with a clock signal ck3. The first clock terminal CK1 of even shift register units are supplied with a clock signal ck4. In addition, the reference terminal VSS of each of the shift register units is supplied with a reference voltage vc.

As shown in FIG. 5, the first output terminal OUT1 of the n-th stage of shift register unit SR(n) is connected with the (2n-1)th gate line G(2n-1), and the second output terminal OUT2 of the n-th stage of shift register unit SR(n) is connected with the 2n-th gate line G(2n).

Figure 6A:
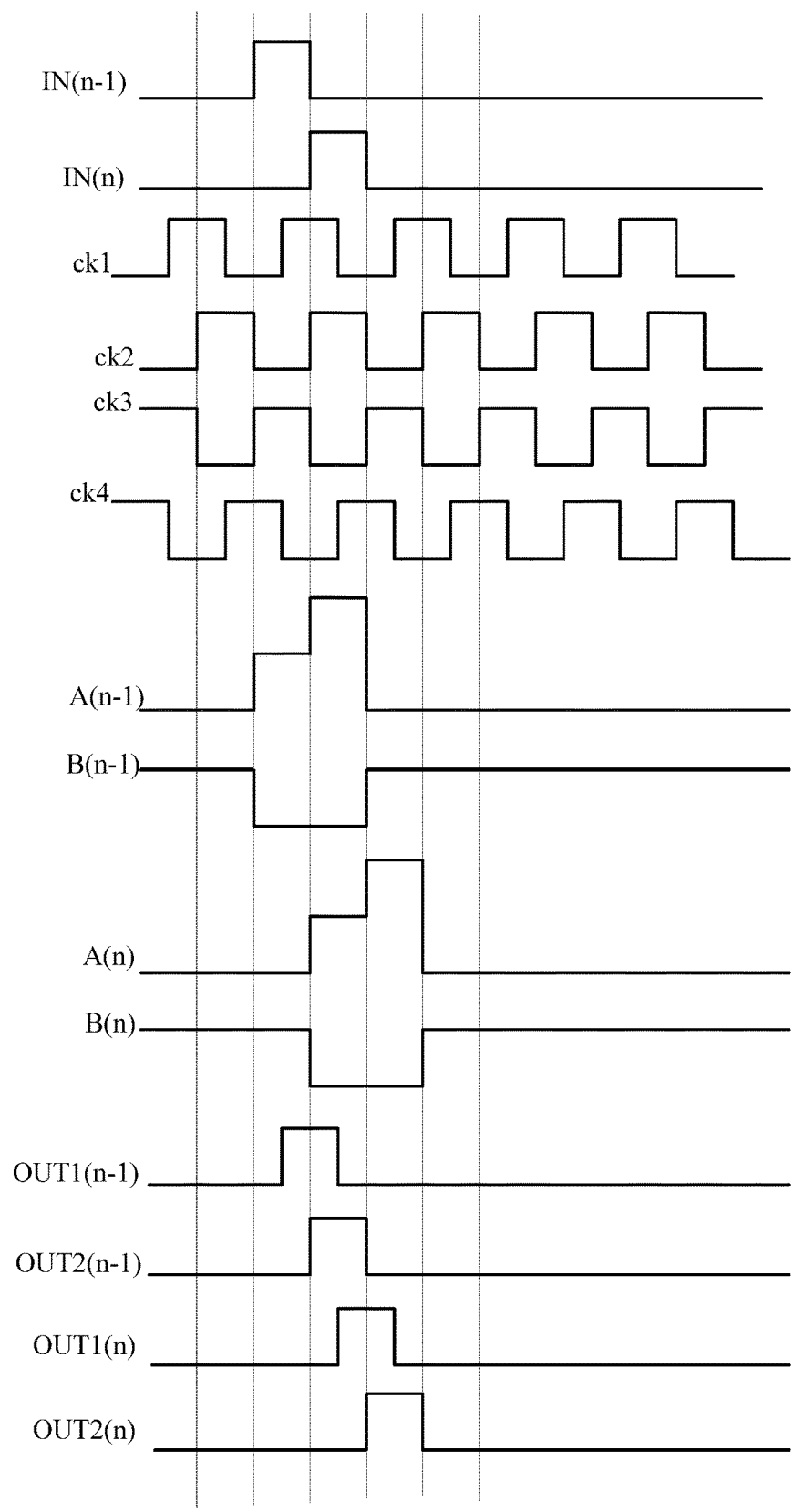
FIG. 6a is a time sequence diagram of the gate driver circuit of FIG. 5.
Figure 6B:
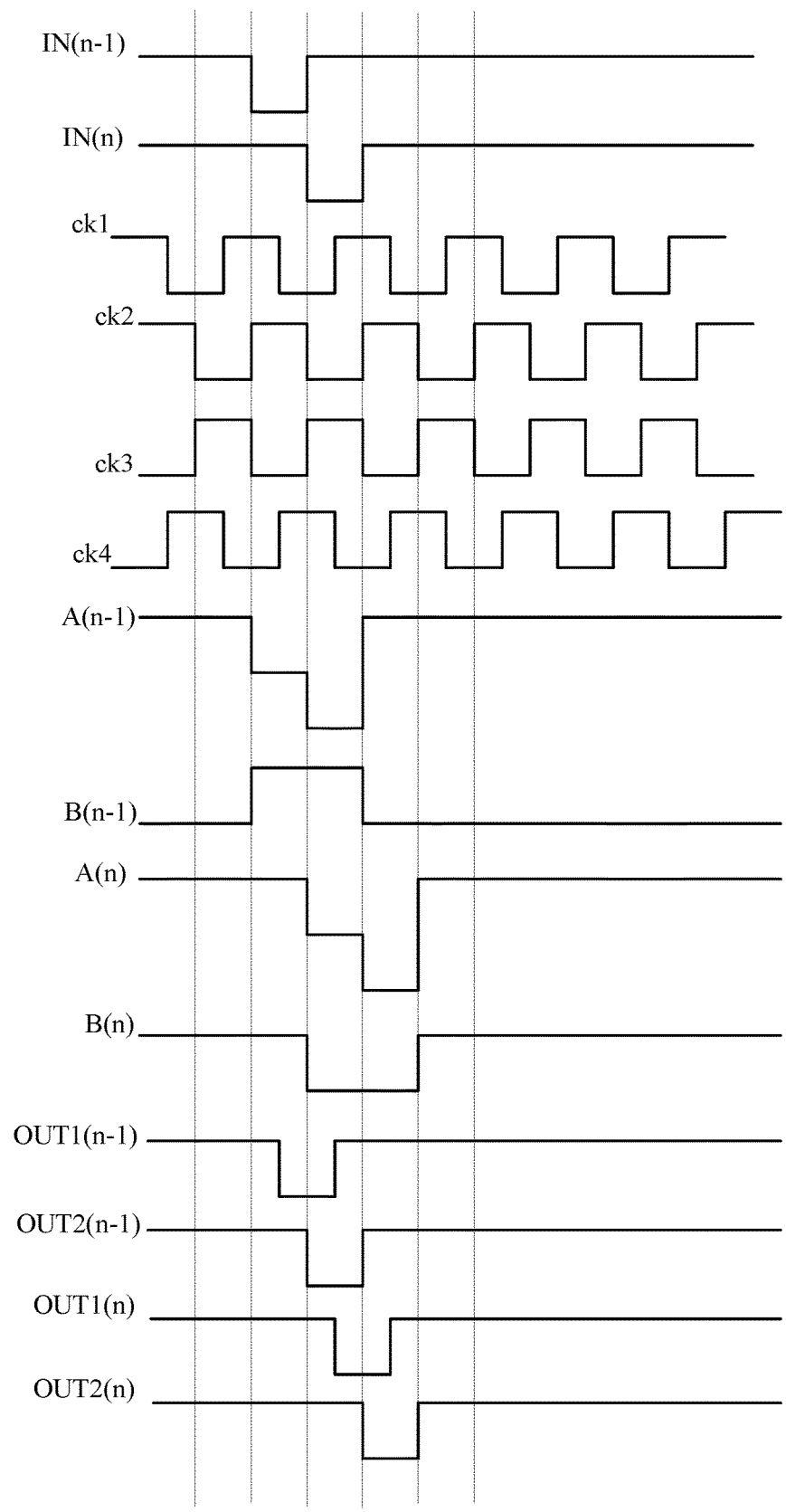
FIG. 6b is another time sequence diagram of the gate driver circuit of FIG. 5.

Operations of the gate driver circuit 500 of FIG. 5 are roughly described in connection with the time sequence diagrams as shown in FIGS. 6a and 6b, wherein the time sequence diagram of FIG. 6a corresponds to a gate driver circuit where the shift register units are formed by N-type transistors, and the time sequence diagram of FIG. 6b corresponds to a gate driver circuit where the shift register units are formed by P-type transistors.

Referring to FIGS. 6a and 6b, IN(n-1) is the input signal provided to the (n-1)th stage of shift register unit SR(n-1), and IN(n) is the input signal provided to the n-th stage of shift register unit SR(n), i.e., the output signal OUT2(n-1) of the (n-1)th stage of shift register unit SR(n-1). The clock signal ck1 and the clock signal ck4 have phases opposite to each other, the clock signal ck2 and the clock signal ck3 have phases opposite to each other, and the clock signal ck1 and the clock signal ck2 have a phase difference of 90° with respect to each other. A(n-1) and B(n-1) are the first voltage signal at the first node A and the second voltage signal at the second node B of the (n-1)th stage of shift register unit SR(n-1), respectively. A(n) and B(n) are the first voltage signal at the first node A and the second voltage signal at the second node B of the n-th stage of shift register unit SR(n), respectively. OUT1(n-1) and OUT2(n-1) are two output signals of the (n-1)th stage of shift register unit SR(n-1). OUT1(n) and OUT2(n) are two output signals of the n-th stage of shift register unit SR(n).

Figure 7:
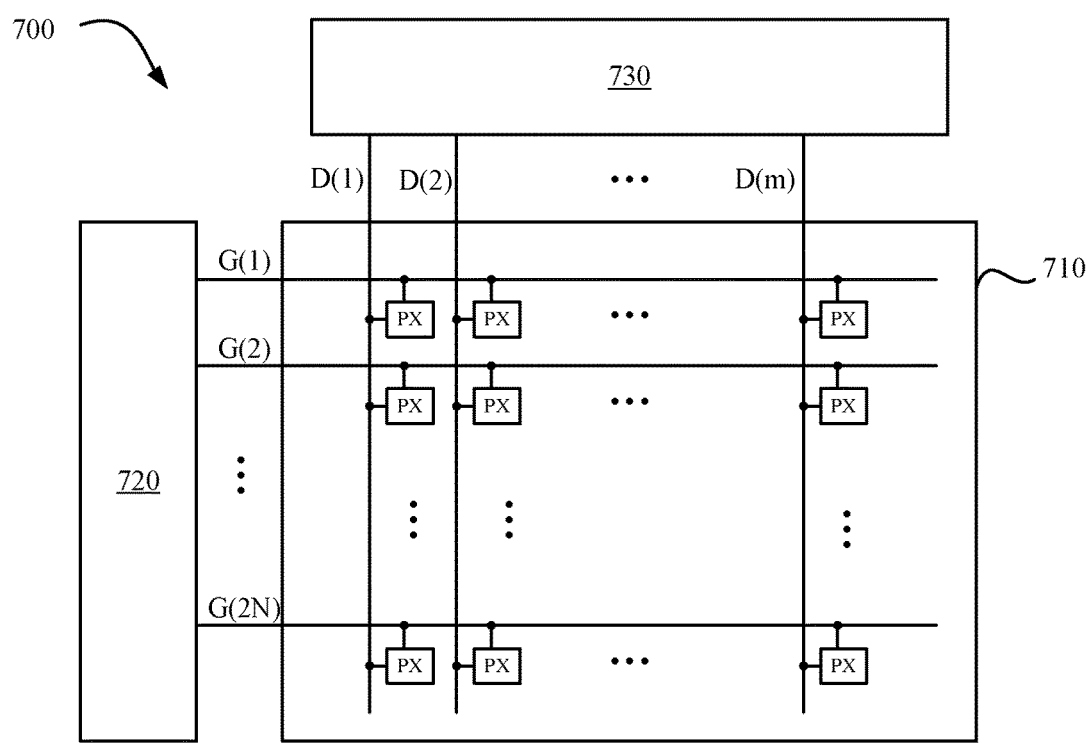
FIG. 7 is a schematic block diagram of a display device according to an embodiment of the present disclosure.

FIG. 7 is a schematic block diagram of a display device 700 according to an embodiment of the present disclosure.

Referring to FIG. 7, the display device 700 includes a display panel 710, a gate driver circuit 720 and a data driver circuit 730.

The display panel 710 includes a plurality of gate lines G(1) to G(2N), a plurality of data lines D(1) to D(m), and a plurality of pixels PX that are coupled to the gate liens G(1) to G(2N) and the data lines D(1) to D(m). Examples of the display panel 710 include a liquid crystal display panel and an organic light-emitting diode display panel.

The gate driver circuit 720 may be the gate driver circuit 500 as described in the above embodiments. The gate driver circuit 720 supplies the gate lines G(1) to G(2N) with respective gate signals.

The data driver circuit 730 supplies the data lines D(1) to D(m) with respective data signals.

In some embodiments, the gate driver circuit 720 and the data driver circuit 730 may be integrated on the display panel 710. In some embodiments, at least one of the gate driver circuit 720 and the data driver circuit 730 may form a separate chip.

The display device 700 may be any product or component that has a display function, such as a cellphone, a tablet computer, a television, a monitor, a notebook computer, a digital photo frame, and a navigator.

According to embodiments of the present disclosure, each shift register unit can output respective two scan signals that have a phase difference with respect to each other, which can be provided to respective two gate lines of the display panel. This may halve the number of the shift register units in the gate driver circuit, and thus reduce the footprint of the gate driver circuit. Thereby, the design with a very narrow bezel is made possible.

Various modifications and variations can be made to the present disclosure by the skilled in the art without departing from the spirit and scope of the present disclosure. Thus, if these modifications and variations to the present disclosure fall within the scope of the appended claims and equivalents thereof, the present disclosure is intended to encompass these modifications and variations.

What is claimed is:

1. A shift register unit comprising:
an input terminal, a reset terminal, a reference terminal, a first clock terminal, a second clock terminal, a third clock terminal, a first output terminal, a second output terminal,
an input circuit for receiving an input signal from the input terminal and providing the input signal to a first node as a first level voltage;
a first reset circuit for receiving a reference voltage from the reference terminal, and providing the reference voltage to the first node as a second level voltage in response to a reset signal from the reset terminal, the second level voltage being logically opposite to the first level voltage;
a node control circuit for receiving a third clock signal from the third clock terminal and the reference voltage, and providing at a second node a second voltage signal logically opposite to a first voltage signal at the first node, the first voltage signal comprising a portion having the first level voltage and a portion having the second level voltage;
a first output circuit for receiving a first clock signal from the first clock terminal and the reference voltage, and selectively providing the first clock signal or the reference voltage to the first output terminal in response to first voltage signal and the second voltage signal; and
a second output circuit for receiving a second clock signal from the second clock terminal and the reference voltage, selectively providing the second clock signal or the reference voltage to the second output terminal in response to the first voltage signal and the second voltage signal, and maintaining a voltage difference between the first node and the second output terminal when the first node is floated,
wherein the node control circuit comprises:
a first node control circuit for providing the reference voltage to the first node in response to the second voltage signal; and
a second node control circuit for providing at the second node the second voltage signal in response to the third clock signal and the first voltage signal.

2. The shift register unit of claim 1, wherein the first clock signal and the second clock signal have a phase difference of 90° with respect to each other, and wherein the third clock signal and the second clock signal have phases opposite to each other.

3. A gate driver circuit comprising a plurality of shift register units as recited in claim 2 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

4. The shift register unit of claim 1, wherein the first node control circuit comprises a seventh transistor having a source connected to the reference terminal, a gate connected to the second node, and a drain connected to the first node.

5. A gate driver circuit comprising a plurality of shift register units as recited in claim 4 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

6. The shift register unit of claim 1, wherein the second node control circuit comprises:
an eighth transistor having a source and a gate jointly connected to the third clock terminal, and a drain;
a ninth transistor having a source connected to the third clock terminal, a gate connected to the drain of the eighth transistor, and a drain connected to the second node;
a tenth transistor having a source connected to the reference terminal, a gate connected to the first node, and a drain connected to the drain of the eighth transistor; and
an eleventh transistor having a source connected to the reference terminal, a gate connected to the first node, and a drain connected to the second node.

7. The shift register unit of claim 1, wherein the input circuit comprises a first transistor having a source and a gate jointly connected to the input terminal and a drain connected to the first node.

8. A gate driver circuit comprising a plurality of shift register units as recited in claim 4 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

9. The shift register unit of claim 1, wherein the first reset circuit comprises a second transistor having a source connected to the reference terminal, a gate connected to the reset terminal, and a drain connected to the first node.

10. A gate driver circuit comprising a plurality of shift register units as recited in claim 9 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

11. The shift register unit of claim 1, wherein the first output circuit comprises:
a third transistor having a source connected to the first clock terminal, a gate connected to the first node, and a drain connected to the first output terminal; and
a fourth transistor having a source connected to the reference terminal, a gate connected to the second node, and a drain connected to the first output terminal.

12. A gate driver circuit comprising a plurality of shift register units as recited in claim 11 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

13. The shift register unit of claim 1, wherein the second output circuit comprises:
a fifth transistor having a source connected to the second clock terminal, a gate connected to the first node, and a drain connected to the second output terminal;
a sixth transistor having a source connected to the reference terminal, a gate connected to the second node, and a drain connected to the second output terminal; and
a capacitor connected between the first node and the second output terminal.

14. A gate driver circuit comprising a plurality of shift register units as recited in claim 13 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

15. The shift register unit of claim 1, further comprising a second reset circuit for providing the reference voltage to the second output terminal in response to the reset signal.

16. The shift register unit of claim 15, wherein the second reset circuit comprises a twelfth transistor having a source connected to the reference terminal, a gate connected to the reset terminal, and a drain connected to the second output terminal.

17. A gate driver circuit comprising a plurality of shift register units as recited in claim 1 that are cascaded with each other, wherein
the input terminal of the first stage of shift register unit is configured to receive a start signal;
the input terminal of each of the shift register units except for the first stage of shift register unit is connected to the second output terminal of a previous stage of shift register unit; and
the reset terminal of each of the shift register units except for the last stage of shift register unit is connected to the second output terminal of a next stage of shift register unit.

18. A display device comprising:
a display panel comprising 2N gate lines, wherein N is a positive integer; and
a gate driver circuit as recited in claim 17,
wherein the first output terminal and the second output terminal of the n-th stage of shift register unit of the gate driver circuit are connected to the (2n−1)th gate line and the 2n-th gate line, respectively, wherein n is a positive integer and $1 \leq n \leq N$.

* * * * *